United States Patent [19]

McKenna

[11] 3,938,182

[45] Feb. 10, 1976

[54] AUTOMATIC CHARACTER SKEW AND SPACING CHECKING NETWORK

[75] Inventor: Robert T. McKenna, Rockville, Md.

[73] Assignee: The United States of America as represented by the United States National Aeronautics and Space Administration Office of General Counsel-Code GP, Washington, D.C.

[22] Filed: Jan. 6, 1975

[21] Appl. No.: 538,983

[52] U.S. Cl. .................................. 360/26; 360/51
[51] Int. Cl.[2] ........................................ G11B 15/02
[58] Field of Search ............................... 360/26, 51

[56] References Cited
UNITED STATES PATENTS

| | | | |
|---|---|---|---|
| 3,710,361 | 1/1973 | Sonberg | 360/26 |
| 3,792,436 | 2/1974 | DeVoy et al. | 360/26 |
| 3,812,531 | 5/1974 | Hall | 360/26 |
| 3,821,798 | 6/1974 | Cannon | 360/51 |
| 3,864,735 | 2/1975 | Davis et al. | 360/51 |

Primary Examiner—Vincent P. Canney
Attorney, Agent, or Firm—Ronald F. Sandler; Gary F. Grafel; John R. Manning

[57] ABSTRACT

A network is disclosed for automatically checking the skew and character spacing of digital tape drive systems to indicate out-of-tolerance conditions of those parameters. The network enables a tape drive to check its own recording accuracy as well as that of tapes recorded on other drives. In operation, the first detected pulse of each character triggers a monostable multi-vibrator which locks out further data pulses and initiates a window pulse equal in length to the maximum permissible skew. At the end of the window pulse data pulses may again be received. If a pulse is received after termination of the window pulse, the skew is determined to exceed specifications and a skew error indication is given by the illumination of a display light, for example. A similar circuit arrangement is provided for detecting character spacing which is less than the minimum required for unambiguous data reproduction.

10 Claims, 5 Drawing Figures

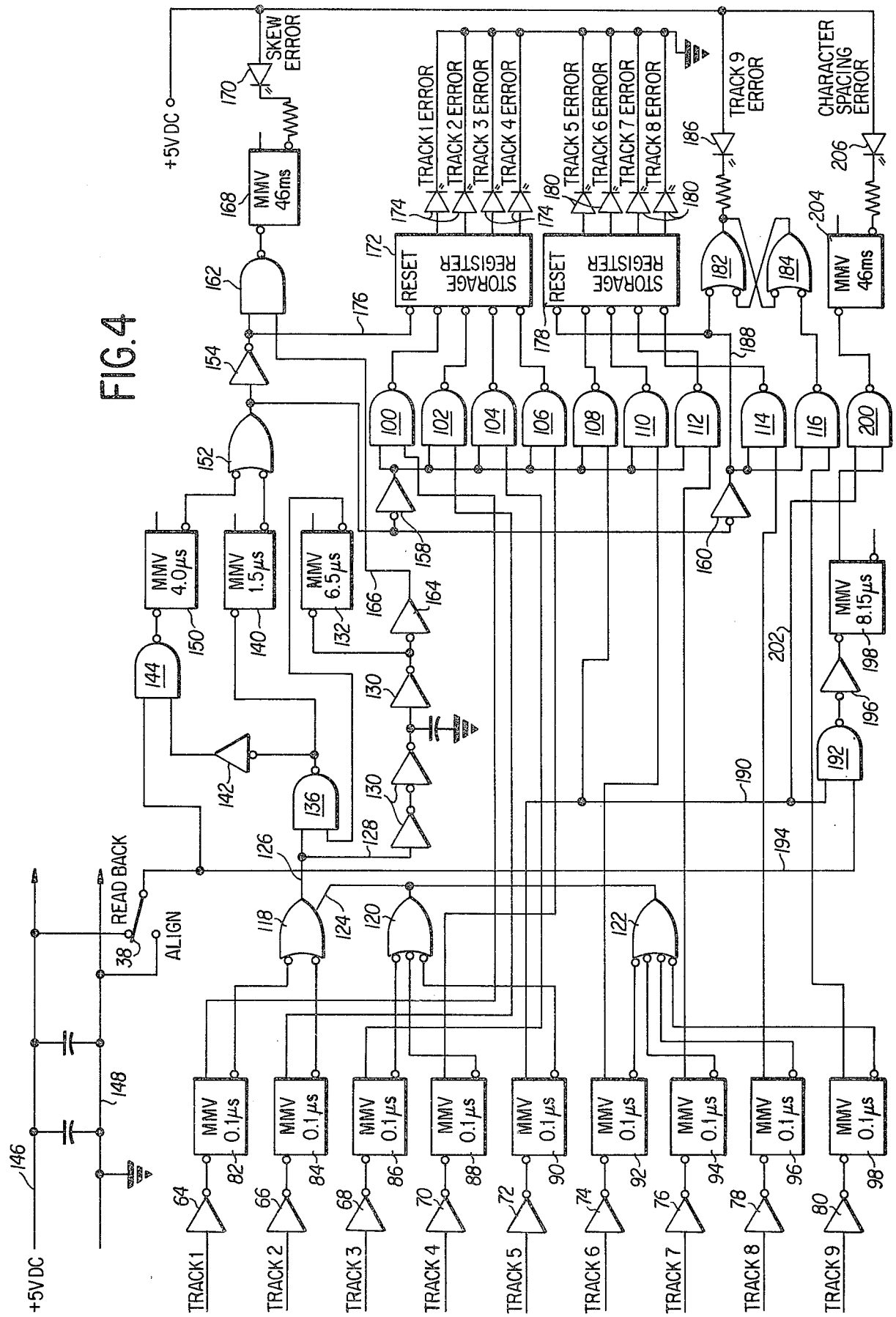

AUTOMATIC CHARACTER SKEW AND SPACING CHECKING NETWORK

ORIGIN OF THE INVENTION

The invention described herein was made by an employee of the United States Government and may be manufactured and used by or for the Government for Governmental purposes without the payment of any royalties thereon or therefor.

BACKGROUND OF THE INVENTION

1. Field of the Invention:

This invention relates generally to magnetic tape monitoring apparatuses, and more particularly to an automatic character skew and spacing checking network for use with computer digitial magnetic tapes.

2. Description of the Prior Art:

In the recent past Government and Industry have been using computers with digital tape drives that permit high density recording, up to 800 characters per inch for example, recorded in the non-return to zero (NRZI) mode. As more equipment of this type is used, a substantial increase in the number of character reading failures has occurred. It has been found that the largest number of reading failures occurs when tapes are read by equipment different from that on which they were recorded, giving rise to serious compatibility problems. Reading failures have occurred in spite of the fact that equipment was maintained to the manufacturers specifications, and in spite of the fact that the most rigorous servicing standards were observed in adjusting and maintaining reading and recording equipment.

Extensive tests directed to resolving these problems have shown that the most common cause of reading failures when attempting to interchange information via digital tape recorded in the non-return to zero mode is a condition called skew. Skew is a product of two factors which result when the characters are not recorded perpendicular to the edge of the recording tape. The first of these factors is static skew, determined by the physical alignment of the recording head and tape guides and also by the alignment of the individual track recording gaps within the head assembly (i.e. gap scatter). The other factor is dynamic skew, a result of the wandering and squirming of the tape as it passes across the recording head. Other factors such as the asymmetry and pattern sensitivity of the recording head also contribute to the overall skew condition. All of these factors are generally lumped together and referred to as "skew" because in practice they are inseparable from a measurement point of view. It has been reliably determined that tape skew accounts for 95% of reading errors due to equipment incompatibility.

FIG. 1 illustrates characters recorded on magnetic rape, showing the effects of skew conditions. In particular, two characters 12 and 14 of recorded data bits 16 are shown at the left of FIG. 1, representing ideal recording conditions with no skew and with a fixed gap 18 between all bits in each of the characters. Two skewed characters 20 and 22 are illustrated at the right side of FIG. 1, showing the effects of gap scatter and the other static and dynamic skewing phenomena mentioned above.

Concerning the need for a sufficient gap between characters, it is emphasized that the reading problems discussed here relate to non-return to zero recording, rather than to phase encoded recording wherein the gap between characters is not critical since the recorded information is self-clocking. In non-return to zero recording, particularly with a packing density of 800 characters per inch, character spacing becomes critical as a character must be written every 1250 microinches with an accuracy of 3%. Since an adequate spacing must exist between characters to prevent ambiguous readouts, character skew must be less than half of the character spacing minus an additional tolerance to provide for read head skew which can never be entirely eliminated.

FIGS. 2A and 2B are diagrams showing gap relationships and illustrating how character reading errors can occur due to insufficient gapping as a result of skew. FIG. 2A illustrates a 9-track tape showing track 1 at the top and track 9 at the bottom of the tape. A first character of 9 skewed bits is illustrated at 24 and a second similarly skewed character is illustrated at 26, both characters separated by a minimum distance of 825 microinches. Both characters 24 and 26 are illustrated as skewed 425 microinches, the maximum writing skew permitted under the American National Standard for recording magnetic tape for information interchange (800 cpi, NRZI). In FIG. 2A the first bit occurs on track 9 on the tape. This bit will trigger a window pulse in the reading apparatus which must be open for at least 425 microinches in order to read a tape written at the maximum skew tolerance mentioned above. The second skewed character 26 is similar to the first in that the first bit also occurs in track 9, so that the recording system leaves a very adequate spacing of 825 microinches between the closest bits of the two skewed characters. Accordingly no reading ambiguity occurs in this situation.

FIG. 2B illustrates the critical worst-case problem where reading ambiguity may occur. A character with only 1 bit in track 1 is illustrated at 28 and a second character with only 1 bit in track 9 is illustrated at 30. Thus, the reading window is opened only as the bit 28 is detected, so that this track 1 bit falls at the beginning of the reading window rather than at the end of it, in contrast to the situation shown in FIG. 2A. The next recorded character 30 has at least one bit in track 9 which, in the illustrated example, is skewed most forward. Thus this bit triggers a second reading window which begins only 400 microinches after the end of the first reading window. Within this 400 microinch gap, a 6% character tolerance must also be provided, equivalent to subtracting 75 microinches from the actual gap. Thus the spacing between the characters is effectively only 325 microinches. Therefore, to maintain reliable operation in the illustrated example, read head static and dynamic skew must be less than 300 microinches, significantly less than the 425 microinch tolerance conventionally permitted.

The 6% tolerance mentioned in the previous paragraph is included since a maximum of ± 3% in character spacing tolerance is permitted by recording specifications and a ± 3% speed tolerance is the usual specified by the tape drive manufacturers.

Speed variations that reduce the character spacing may also impair the tape drive's ability to distinguish between characters. For example, with a recording density of 800 cpi, a character is written every 11.8 microseconds. If the tape is moving slower than the normal speed of 112.5 inches per second, the characters will be spaced closer together with the result that the characters may be spaced too closely to be read by other tape drives, or even by the writing tape drive when it is not stopped between records.

In view of the problems described above, it is apparent that magnetic tape recording equipment must be carefully monitored to minimize the skew in recording and reading heads if recorded tapes are to be compatable with different types and models of equipment. No satisfactory equipment has been available in the past for providing such monitoring in a truly convenient and reliable manner.

A need therefore exists for an apparatus to automatically check character skew and spacing to ensure that recorded tapes will be compatible with different types of reading equipment.

SUMMARY OF THE INVENTION

Accordingly, one object of this invention is to provide a novel network for automatically checking character skew and spacing.

Another object of this invention is to provide a novel system for detecting skew and spacing errors in tape recording and reproducing equipment.

Yet another object of this invention is the provision of a logic network for identifying which track or tracks of a multiple track tape transport are out of alignment.

A still further object of this invention is the provision of a highly reliable and conveniently usable logic network for checking character skew and spacing in magnetic tape recording and reproducing apparatuses.

Briefly, these and other objects of the invention are achieved by providing a network for detecting the first bit of a recorded character, and for establishing a time interval equal to the maximum permissible skew beginning on detection of this first recorded bit. A late pulse detector is provided for monitoring bits received after the time interval has elapsed indicating the presence of a larger degree of skew than is permissible. A similar network is provided for monitoring character spacing. Suitable display indicators are coupled to both networks to convey output information.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
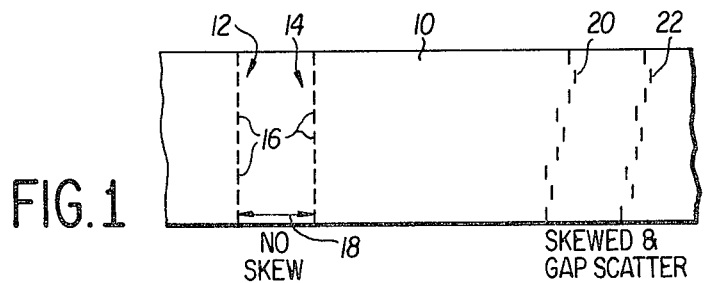
FIG. 1 is a schematic illustration of a recorded tape illustrating ideal and skewed recording.
Figure 2A:
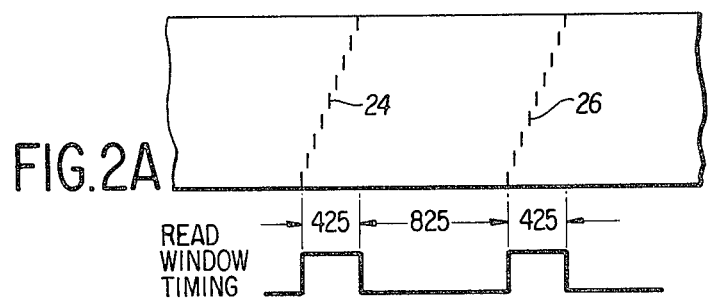
FIG. 2A is a schematic illustration of a recorded tape showing skewed recordings which can be read without ambiguity.
Figure 2B:
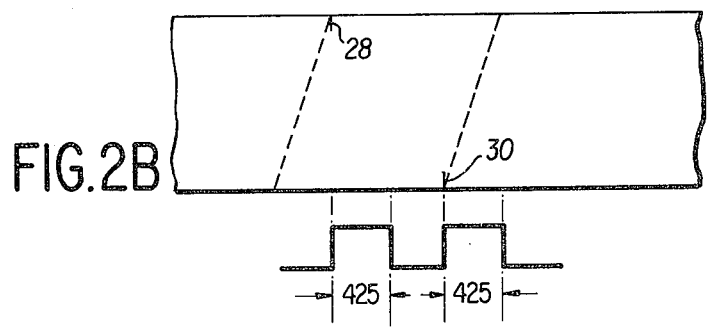
FIG. 2B is an illustration of a recorded tape showing skewed recordings which cannot be read without ambiguity.
Figure 3:
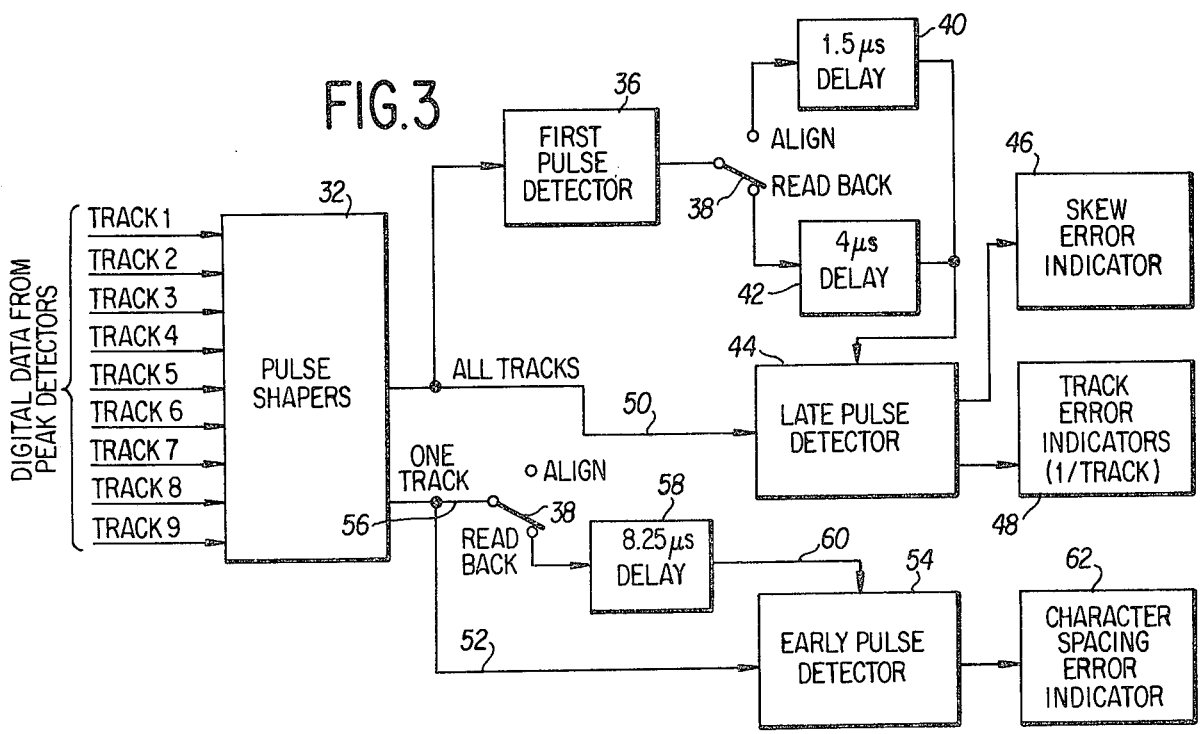
FIG. 3 is a functional block diagram of the apparatus of the present invention; and, FIG. 4 is a logic block and schematic diagram of the circuitry of the present invention.

Referring now to the drawings, wherein like reference numerals designate identical or corresponding parts throughout the several views, and more particularly to FIG. 3 thereof, the present invention is illustrated in the form of a functional block diagram. In particular, a series of pulse shapers 32 is illustrated as receiving input information from all 9 tracks of a 9-track recording and reproducing system. The 9 recording track inputs are in the form of digital data derived from conventional peak detectors (not shown) associated with the tape recording and reproducing system. The outputs of all 9 pulse shapers in the block 32 are fed serially over a line 34 to a first pulse detector 36, the purpose of which is to detect the first pulse generated by the signals received on the 9 recording tracks. The output of the first pulse detector 36 is fed through an align-readback switch 38 to either a 1.5 microsecond delay 40 or a 4.0 microsecond delay 42, depending upon the position selected for the switch 38. The outputs of the two delays are coupled in parallel to a late pulse detector 44, the output of which is coupled to a skew error indicator 46 and a track error indicator 48 which includes a separate indicator for each of the 9 input tracks. The inputs from each of the 9 traks are also fed in parallel over a line 50 for providing individual track error indications.

The operation of the descirbed network is as follows. Assuming it is desired to align the reading heads of a tape system, the switch 38 is set to the align position, whereby the delay 40 is switched into the circuit. This delay is set for 1.5 microseconds corresponding to the standard read head skew permissible in 800 cpi NRZI recordings. Clearly, this delay can be set to other values corresponding to other recording densities and tape speeds. A skew alignment tape is then processed by the attached tape drive (not shown) and the detected signals arrive on the 9 track to be shaped by pulse shapers 32. The resulting shaped pulses are fed over line 34 to first pulse detector 36 which identifies the first pulse to arrive and triggers the delay 40, applying a signal to the late pulse detector 44. Any pulses arriving after the 1.5 microsecond delay interval has elapsed are applied to the late pulse detector 44 for activating the skew error indicator 46, indicating that the read head is out of alignment. The particular track or tracks on which the late pulses arrive are also identified by the track error indicators 48 so that the misaligned tracks can be easily identified and aligned.

Essentially the same operation is followed for aligning the recording heads, except in this case the switch 38 is adjusted to the readback position so that a 4.0 microsecond delay (or another suitable delay for different recording speeds and densities) is set into the circuit. A series of ones is then recorded on the tape by the recording head to be checked and this series of ones is played back into the monitoring circuit illustrated in FIG. 3. Again, the circuit identifies whether a skew error exists and also identifies the offending track.

A character spacing error indicating circuit is also included in the device illustrated in FIG. 3. This circuit, illustrated at the lower portion of FIG. 3, is coupled to one track such as track 5, the output of which is fed over a line 52 to an early pulse detector 54. The output of the same track is fed over a line 56 through the switch 38 (only when the switch is in the readback position) to an 8.25 microsecond delay 58. Again, it will be clear to those skilled in the art that the delay may be adjusted depending upon the speed and density parameters of the tape and recording system to be checked. The output of the delay 58 is fed through a line 60 to the early pulse detector, the output of which drives a character spacing error indicator 62. In operation, the signal received on the selected track (e.g. track 5) triggers the delay 58 which prevents actuation of the early pulse detector 54 until the delay is timed out, in this case until at least 8.25 microseconds has elapsed. Any pulse occurring on line 52 after the delay is timed out triggers the early pulse detector 54 which in turn activates the character spacing error indicator 62 whereby the system indicates that the characters in the recorded information are too closely spaced to be accurately read back.

A more detailed explanation of the structure and mode of operation of the present invention will now be set forth, particularly with reference to the detailed schematic diagram of the invention as set forth in FIG. 4. The 9 recording track outputs are shown at the left-hand side of FIG. 4, and as in FIG. 3, these outputs receive signals from peak detectors coupled to magnetic reading or recording heads. Each of the 9 track outputs is fed through one of inverters 64–80 to a corresponding monostable multi-vibrator or "one-shot" 82–98. The monostable multi-vibrators convert the relatively long peak detection signals from the tape head into 0.1 microsecond pulses which lend themselves to good scope triggering and visual positioning. The positive outputs of the monostable multi-vibrators 82-98 are each respectively coupled to one input of a group of two-input NAND gates 110–116. The negative outputs of monostable multi-vibrators 82 and 84 are coupled to the two inputs of a NOR gate 118. The negative outputs of monostable multi-vibrators 86, 88 and 90 are similarly coupled to the three inputs of a NOR gate 120, and the negative outputs of the four remaining monostable multi-vibrators 92, 94, 96 and 98 are coupled to the four inputs of a third NOR gate 122. The outputs of NOR gates 120 and 122 are coupled through a line 124 to a node input of NOR gate 118, whereby the outputs of the three NOR gates 118, 120 and 122 are combined so that a signal originating in any of the 9 tracks will cause a 0.1 microsecond pulse produced by the appropriate monostable multi-vibrator to appear on line 126 at the output of NOR gate 118. This pulse is fed over line 128 through a group of inverters 130, which together with a capacitor 131 function as a delay, to a monostable multi-vibrator 132 having a 6.5 microsecond period. The output of monostable multi-vibrator 132 is applied over a line 134 to one input of a NAND gate 136, the other input of which receives the output of NOR gate 118 via line 126.

The output of NAND gate 136 is applied over a line 138 to a monostable multi-vibrator 140, shown as having a 1.5 microsecond period, corresponding to delay 40 illustrated in FIG. 3. The output of NAND gate 136 is similarly coupled through an inverter 142 to one input of a NAND gate 144, the other input of which is coupled to align-readback switch 38. It is noted that the readback contact of the switch 38 is coupled to a power line 146 preferably carrying 6 volts DC, while the align contact of the switch is coupled to a power line 48, preferably coupled to a reference potential such as ground.

The output of NAND gate 144 is coupled to a monostable multi-vibrator 150 illustrated as having a period of 4.0 microseconds. The outputs of both monostable multi-vibrators 140 and 150 are coupled to the two inputs of a NOR gate 152, the output of which is coupled to a single inverter 154, and through a line 156 to an additional pair of inverters 158 and 160 which are connected to inputs of NAND gates 100–116 for applying control signals thereto. The output of inverter 154 is coupled to one input of a late character NAND gate 162, the other input of which is coupled to the output of NOR gate 118 through delay inverters 130, inverter 164 and line 166. The output of the late character NAND gate 162 is coupled to a late character monostable multi-vibrator 168, illustrated as having a 46 millisecond period, coupled at its output to a light emitting diode 170 for providing a skew error indication, as illustrated at 46 in FIG. 3.

NAND gates 100–106, coupled to the outputs of monostable multi-vibrators 82–88, respectively, and to the output of inverter 158, have their outputs connected to the inputs of a storage register 172. The outputs of the storage register are coupled to four light emitting diodes 174 for providing a track error indicator as illustrated at 48 in FIG. 3. A reset line 176 is coupled between the output of inverter 154 and a reset input of the storage register 172 for resetting the storage register at appropriate intervals. NAND gates 108–114 similarly receiving inputs from monostable multi-vibrators 92–96 and from inverters 158 or 160 are coupled to four inputs of a second storage register 178, the four outputs of which are coupled to four light emitting diodes 180 comprising a portion of the track error indicator. NAND gate 116, receiving inputs from monostable multi-vibrator 98 and inverter 160, is coupled at its output to a pair of NOR gates 182 and 184 connected in a flip-flop configuration for providing an extra storage register stage. The output of these two interconnected flip-flops is coupled to another light emitting diode 186, completing the track error indicator illustrated at 48 in FIG. 3. A line 188 couples the output of inverter 160 to the reset input of second storage register 178 and also to one input of NOR gate 182 for resetting the storage register and the extra flip-flop stage formed of NOR gates 182 and 184.

Attention is now directed to the character spacing error indicating network also shown in FIG. 4. More particularly, a line 190 couples the positive output of monostable multi-vibrator 90, corresponding to the track 5 input from the tape head, to one input of a NAND gate 192. Another line 194 couples the remaining input of NAND gate 192 to the align-readback switch 38 for controlling the operation of the character spacing error indicator.

The output of NAND gate 192 is coupled through an inverter 196 to a monostable multi-vibrator 198 having a period of 8.15 microseconds. The output of monostable multi-vibrator 198 is coupled to one input of an early pulse detector NAND gate 200, the other input of which is coupled to the output of monostable multi-vibrator 90 through lines 190 and 202. The output of early pulse detector NAND gate 200 is applied to the input of a character spacing error monostable multi-vibrator 204 having a period of 46 milliseconds, and coupled at its output to a light emitting diode 206 acting as a character spacing error indicator, as illustrated at 62 in FIG. 3.

Having described the manner in which the components of the novel circuit are interconnected, the operation of the illustrated embodiment of the invention will now be described in more detail. Initially, pulses arriving at any of the 9 track inputs from the peak detection circuitry trigger one or more of the monostable multi-vibrators 82–98, resulting in the generation of narrow (0.1 microsecond) pulses. Since the outputs of all of these monostable multi-vibrators are coupled together through NOR gates 118, 120 and 122, any pulse generated by one of the monostable multi-vibrators will appear on line 126 where it is applied to NAND gate 136 and simultaneously to the delay inverters 130. After the brief delay interval imposed by these delay circuits (30 to 50 nanoseconds for example) the pulse is applied to monostable multi-vibrator 132, triggering it, whereby a 6.5 microsecond negative output is applied to NAND gate 136, inhibiting the gate until the period of the monostable multi-vibrator 132 is timed out so that no further pulses will pass the NAND gate 136.

The output of NAND gate 136 is the first pulse generated by the monostable multi-vibrators 82–98. This output triggers either of monostable multi-vibrators 140 or 150, depending upon the setting of align-readback switch 38. The output of the selected one of these two multi-vibrators is applied to NOR gate 152 for applying an inhibiting signal to inverters 158 and 160. This inhibiting signal is applied to all of the NAND gates 100–116 in the track error indicating network, so that no signal can pass the track error NAND gates until the selected monostable multi-vibrator has timed out. Similarly, the output of the selected monostable multi-vibrator inhibits NAND gate 162 so that the skew error indicator monostable multi-vibrator 168 cannot be triggered.

After the selected monostable multi-vibrator 140 or 150 has timed out, the NAND gates 100–116 are enabled, as is the NAND gate 162 due to termination of the inhibiting signals applied to these gates. Thus any pulses generated by the monostable multi-vibrators 82–98 after the selected monostable multi-vibrator 140 or 150 has timed out will be passed through NOR gate 118 along line 128, through inverter 164 and line 166 to enabled NAND gate 162, whereby monostable multi-vibrator 168 is triggered, turning on light emitting diode 170 for providing a skew error indication. The monostable multi-vibrator 168 holds the light emitting diode 170 on for an extended interval, 46 milliseconds for example, for ease of observation. Simultaneously, any late pulse is fed from the monostable multi-vibrators 82–98 over the appropriate line to one of the enabled NAND gates 100–116. The outputs of these individual NAND gates are applied to the holding registers 172 and 178 or to the additional flip-flop stage comprised of NOR gates 182 and 184. Pulses transmitted by any of the NAND gates 100–116 are stored in the flip-flops comprising the holding register (and of course the auxiliary flip-flop stage) causing an appropriate one of the nine LEDs 174, 180 and 186 to be lighted indicating the track on which the skewing error has occurred. Thus, as the circuit operates, one or more of the indicator LEDs will continue to flash on indicating which track or tracks are out of alignment and producing skewing errors, and the LED 170 will remain lighted as long as skewing errors are detected.

When the align-readback switch 38 in the align position, the character spacing error indicating circuitry is disabled. However, when the switch 38 is in the readback position, NAND gate 192 is enabled for receiving a signal from monostable multi-vibrator 90 coupled to track 5 of the tape system. The output of NAND gate 192 is passed through inverter 196 to trigger monostable multi-vibrator 198 which provides an output pulse of 8.15 microsecond duration to inhibit NAND gate 200 for this interval. After the monostable multi-vibrator 198 is timed out, NAND gate 200 is enabled and any subsequent pulse arriving on track 5 will result in the generation of a pulse which will pass through NAND gate 200 to trigger monostable multi-vibrator 204 causing LED 206 to light, indicating the occurrence of a character spacing error.

It is again noted that the periods of the illustrated monostable multi-vibrators 140, 150 and 198 respectively were selected to correspond to the standard tolerances alotted to tape reading heads, tape writing heads and character spacing, respectively, for 800 cpi NRZI recorded tapes travelling at 112.5 inches per second. It will be obvious to those skilled in the art that all of these timing intervals, as well as the other timing intervals specifically mentioned can be easily adjusted to conform to other tape speeds and tape character densities. Thus the illustrated circuit can be easily modified for monitoring virtually any type of data tape handling system.

The circuit illustrated in FIG. 4 can be constructed on a single circuit card that may be pluged into a spare card slot of a tape drive to be monitored. The circuit may then be left in the tape drive to provide continuous monitoring, or can be used as a test instrument for temporarily monitoring individual tape drives to determine if they are properly aligned. The schematic logic block diagram of FIG. 4 is intended to show the diode transistor logic (DTL) family of integrated circuits. The circuit can, of course, easily be constructed of other families of circuits, such as TTL circuits, as will be apparent to those skilled in the art.

In using the apparatus of the present invention for monitoring read head alignment, the align-readback switch is first set to the align position. A good skew alignment tape, of the type produced by IBM Corporation, for example, is mounted on the tape transport to provide the necessary signal information. The tape is then read while the skew error indicator and track error indicators of the circuit of the present invention are observed. When skew errors are indicated the late or skewed tracks are also identified by the individual track error LEDs and can be adjusted until the skew error LED 170 is extinguished. At this time all tracks are reading within the 1.5 microsecond skew calibration in accordance with U.S. standards. If the tape drive cannot hold or be adjusted within this tolerance, it will very likely be unable to give reliable 800 cpi interchange performance, and thus will probably not be suitable for reliable high speed operation at maximum character densities.

To align the write head, it is necessary to first complete alignment of the read head as described above. The align-readback switch is then set to the readback position, and characters comprised entirely of ones are continuously recorded on a length of tape while the LED indicators of the tape drive monitoring circuit of the present invention are observed. Again, skew error indications or track error indications will determine which, if any, tracks require adjustment. The tracks can then be individually adjusted until no error indications occur.

After both read and write heads have been aligned, the tape is rewound and removed. An output tape is then mounted and records of all ones characters are recorded down the length of tape, stopping between each record. The tape is rewound and the monitor of the invention is switched to the "align" position. The tape is then read back. The monitor is now testing to see if the "static" skew is within the 1.5 microsecond specification. When satisfactory results are obtained in this mode then a random data pattern is recorded in similar fashion. The monitor is then set to the "read back" position. The tape is then read back without stopping. Dynamic skew problems will then be indicated by the skew indicator. Such problems must be corrected by adjustments to the tape transport mechanism itself. Tape speed problems will also be indicated by the character spacing indicator. Speed problems may be analyzed by using an osciloscope to determine where the character spacing errors occur in a particular record.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A network for monitoring character skew and spacing in a tape recording and reproducing system comprising:
   a plurality of pulse shaping means adapted to be coupled to a like plurality of track outputs from said tape recording and reproducing system,
   first pulse detector means for detecting the first pulse generated by said pulse shaping means,
   late pulse detecting means coupled to said pulse shaping means for receiving pulses therefrom,
   first timing means coupled to said first pulse detector means and to said late pulse detecting means for inhibiting said late pulse detecting for a first predetermined interval following detection of said first pulse; and,
   skew error indicating means coupled to said late pulse detecting means for indicating the existance of late pulses representing an unacceptable skew condition.

2. A network as in claim 1, further comprising:
   early pulse detecting means coupled to one of said pulse shaping means for sensing the output of a pulse therefrom,
   second timing means coupled to said one pulse shaping means and to said early pulse detecting means for inhibiting said early pulse detecting means for a second predetermined interval upon receiving a first pulse from said one pulse shaping means; and,
   character spacing error indicating means coupled to said early pulse detecting means for indicating the existance of early pulses, representing an unacceptable character spacing condition.

3. A network as in claim 2, further comprising:
   third timing means coupled to said late pulse detecting means for inhibiting said late pulse detecting means for a third predetermined interval; and,
   selector switch means coupled between said first pulse detector means and said first and third timing means for permitting said late pulse detecting means to be selectively inhibited for either said first or said third predetermined interval.

4. A network as in claim 3, wherein:
   said selector switch means is also coupled to said second timing means for selective disablement thereof.

5. A network as in claim 1, wherein:
   said pulse shaping means comprise monostable multi-vibrators.

6. A network as in claim 5, wherein said first pulse detector means comprises:
   a plurality of NOR gate means coupled to said monostable multi-vibrators for combining the outputs thereof,
   a first NAND gate coupled to said NOR gates for receiving said combined outputs of said monostable multi-vibrators; and,
   fourth timing means coupled to said first NAND gate to inhibit said first NAND gate after said first pulse has been received thereby.

7. A network as in claim 6, wherein said late pulse detecting means comprises:
   a second NAND gate coupled to said first timing means. whereby said second NAND gate is inhibited, and to said NOR gate means for receiving pulses from said plurality of monostable multi-vibartors.

8. A network as in claim 1, wherein said skew error indicating means comprises:
   first logic gate means coupled to said plurality of pulse shaping means and to said first timing means for passing pulses from said pulse shaping means after said first predetermined interval has elapsed,
   a first electroluminescent means coupled to and controlled by said first logic gate means for indicating an unacceptable skew condition,
   a plurality of logic gate means, each coupled to one of said pulse shaping means and to said first timing means whereby said logic gate means are inhibited during said first predetermined interval,
   storage means coupled to said plurality of logic gate means for temporaily storing the outputs thereof; and,
   a plurality of electroluminescent means coupled to said storage means for identifying tracks of said tape recording and reproducing apparatus which are out of alignment.

9. A network as in claim 2, wherein said early pulse detecting means comprises:
   logic gate means coupled to a selected one of said pulse shapers for receiving pulses therefrom; and,
   fifth timing means coupled to said logic gate means for inhibiting said logic gate means for a fifth predetermined interval, whereby said logic gate means is prevented from activating said character spacing error indicating means until said fifth predetermined interval has elapsed.

10. A network as in claim 9, wherein said character spacing error indicating means comprises:
    sixth timing means coupled to said logic gate means for actuation thereby; and,
    electroluminescent means coupled to said sixth timing means for energization thereby.

* * * * *